(12) United States Patent
Kobayashi et al.

(10) Patent No.: US 10,748,954 B2
(45) Date of Patent: Aug. 18, 2020

(54) SOLID-STATE IMAGE PICKUP DEVICE

(71) Applicant: CANON KABUSHIKI KAISHA, Tokyo (JP)

(72) Inventors: Masahiro Kobayashi, Tokyo (JP); Yusuke Onuki, Fujisawa (JP); Toru Koizumi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/798,179

(22) Filed: Feb. 21, 2020

(65) Prior Publication Data
US 2020/0194487 A1 Jun. 18, 2020

Related U.S. Application Data

(63) Continuation of application No. 15/876,697, filed on Jan. 22, 2018, now Pat. No. 10,608,038, which is a continuation of application No. 15/674,419, filed on Aug. 10, 2017, now Pat. No. 9,911,783, which is a continuation of application No. 15/498,197, filed on
(Continued)

(30) Foreign Application Priority Data

Feb. 16, 2015 (JP) .................... 2015-027924

(51) Int. Cl.
*H01L 21/00* (2006.01)
*H01L 27/146* (2006.01)
*H04N 5/3745* (2011.01)
*H04N 5/359* (2011.01)

(52) U.S. Cl.
CPC .... *H01L 27/14643* (2013.01); *H01L 27/1463* (2013.01); *H01L 27/14603* (2013.01); *H01L 27/14612* (2013.01); *H01L 27/14656* (2013.01); *H04N 5/3592* (2013.01); *H04N 5/37452* (2013.01)

(58) Field of Classification Search
CPC ......... H01L 27/14643; H01L 27/14603; H01L 27/14612; H01L 27/1463; H01L 27/14656; H04N 5/3592; H04N 5/37452
See application file for complete search history.

(56) References Cited

U.S. PATENT DOCUMENTS 6,091,793 A 7/2000 Kamashita
6,157,072 A * 12/2000 Nakayama ........ H01L 27/14601
257/443
(Continued)

FOREIGN PATENT DOCUMENTS

JP H11-177076 A 7/1999
JP 2010-056430 A 3/2010
(Continued)

OTHER PUBLICATIONS

Akira Suzuki; "Japanese Office Action for JP Application No. 2017-220338;" dated Mar. 12, 2019; pp. 1-14.

*Primary Examiner* — Richard A Booth
(74) *Attorney, Agent, or Firm* — Canon U.S.A., Inc. IP Division

(57) ABSTRACT

A solid-state image pickup device is provided which can inhibit degradation of image quality which may occur when a global electronic shutter operation is performed. A gate drive line for a first transistor of gate drive lines for pixel transistors is positioned in proximity to a converting unit.

9 Claims, 14 Drawing Sheets

Related U.S. Application Data

Apr. 26, 2017, now Pat. No. 9,761,626, which is a continuation of application No. 15/040,727, filed on Feb. 10, 2016, now Pat. No. 9,666,633.

(56) References Cited

U.S. PATENT DOCUMENTS

| | | | |
|---|---|---|---|
| 2006/0065896 A1* | 3/2006 | Abe | H01L 27/1463 257/69 |
| 2007/0187787 A1* | 8/2007 | Ackerson | H01L 27/14625 257/428 |
| 2010/0155576 A1* | 6/2010 | Merrill | H04N 5/3741 250/208.1 |
| 2011/0242386 A1 | 10/2011 | Machida | |

FOREIGN PATENT DOCUMENTS

| | | |
|---|---|---|
| JP | 2011-061521 A | 3/2011 |
| JP | 2011-216970 A | 10/2011 |
| WO | 2008/096799 A1 | 8/2008 |
| WO | 2011043432 A1 | 4/2011 |

\* cited by examiner

SOLID-STATE IMAGE PICKUP DEVICE

CROSS-REFERENCE TO RELATED APPLICATION

This application is a Continuation of U.S. application Ser. No. 15/876,697, filed Jan. 22, 2018; which is a Continuation of U.S. application Ser. No. 15/674,419, filed Aug. 10, 2017; which is a Continuation of U.S. application Ser. No. 15/498,197, filed Apr. 26, 2017, now U.S. Pat. No. 9,761,626, issued Sep. 12, 2017; which is a Continuation of U.S. application Ser. No. 15/040,727, filed Feb. 10, 2016, now becomes U.S. Pat. No. 9,666,633, issued on May 30, 2017, which claims priority from Japanese Patent Application No. 2015-027924, filed Feb. 16, 2015, which are hereby incorporated by reference herein in their entireties.

BACKGROUND OF THE INVENTION

Field of the Invention

The present invention relates to positioning of drive lines in a solid-state image pickup device.

Description of the Related Art

In recent years, image pickup devices such as a digital camcorder and a digital camera applying a CMOS image sensor suitable for low power consumption and high speed readout have been generally available. A CMOS image sensor having a plurality of pixels each containing a photoelectric converting unit arranged in row and column directions is proposed which is configured as a global electronic shutter in which an exposure start and an exposure end are electronically controlled simultaneously in all of the pixels (International Publication No. WO 11/043432).

SUMMARY OF THE INVENTION

A device according to an aspect of the present invention having an image sensing region in which a plurality of pixels are arranged in a matrix form, each of the pixels having a converting unit, a first transistor configured to transfer electric carriers in the converting unit, an accumulating portion configured to accumulate electric carriers transferred from the first transistor, a second transistor configured to transfer electric carriers from the accumulating portion, a floating diffusion (hereinafter, called an FD) configured to accumulate electric carriers transferred from the second transistor, and a reset transistor configured to reset a potential of the FD includes gate drive lines for a plurality of pixel transistors configured to drive gates of the pixel transistors each including the first transistor, the second transistor, and the reset transistor, the gate drive lines extending in a direction of rows of the pixels in one wiring layer. In this case, a gate drive line for the first transistor among the gate drive lines for the pixel transistors is positioned in proximity to the converting unit in driving wiring of rows (n−1), rows (n), and rows (n+1) provided correspondingly to rows of the pixels.

Further features of the present invention will become apparent from the following description of exemplary embodiments with reference to the attached drawings.

DESCRIPTION OF THE EMBODIMENTS

First Embodiment

Figure 1:
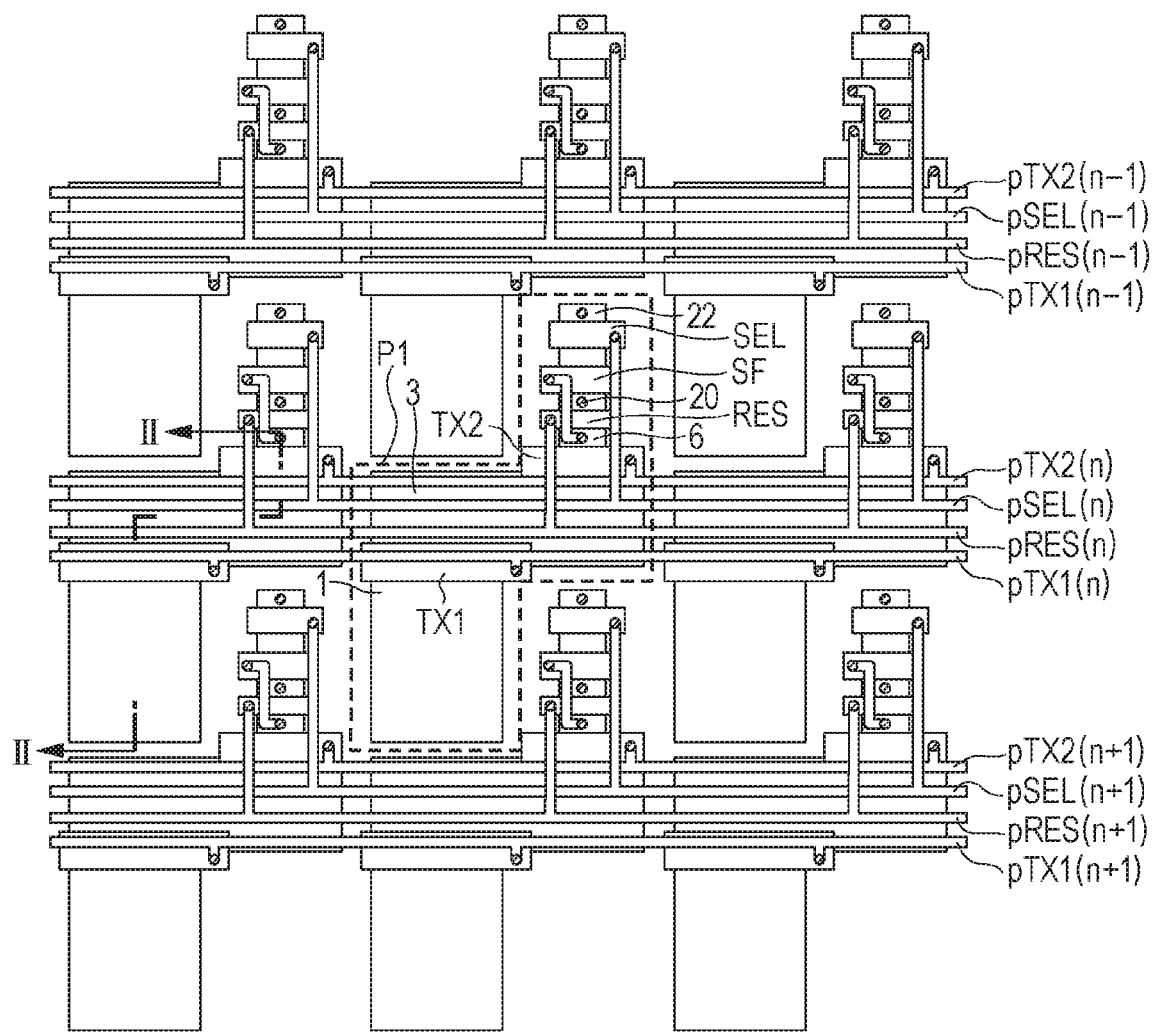
FIG. 1 is a plan view illustrating pixels according to a first embodiment of the present invention.
Figure 2:
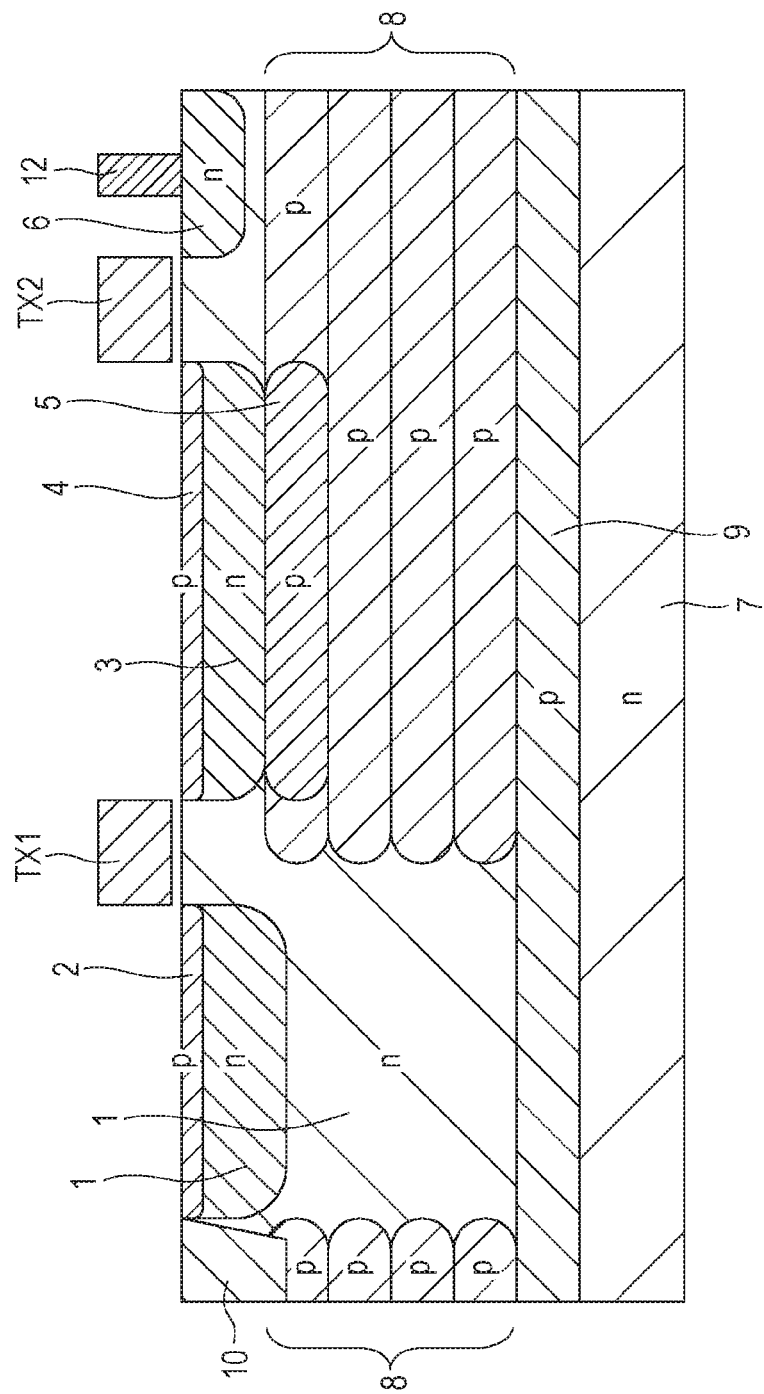
FIG. 2 is a cross section view of pixels according to the first embodiment of the present invention.
Figure 3:
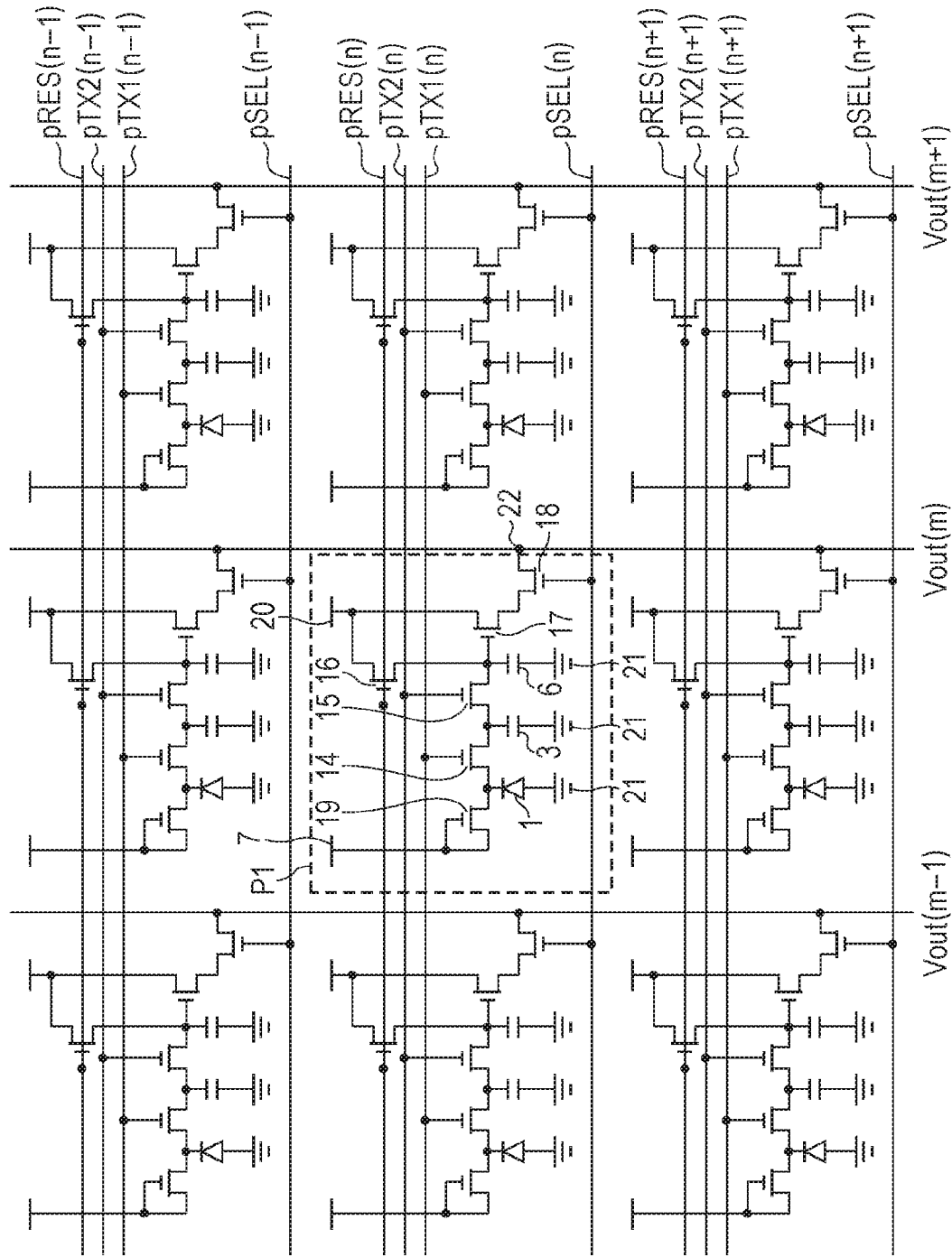
FIG. 3 is a pixel circuit diagram according to the first embodiment of the present invention.
Figure 4:
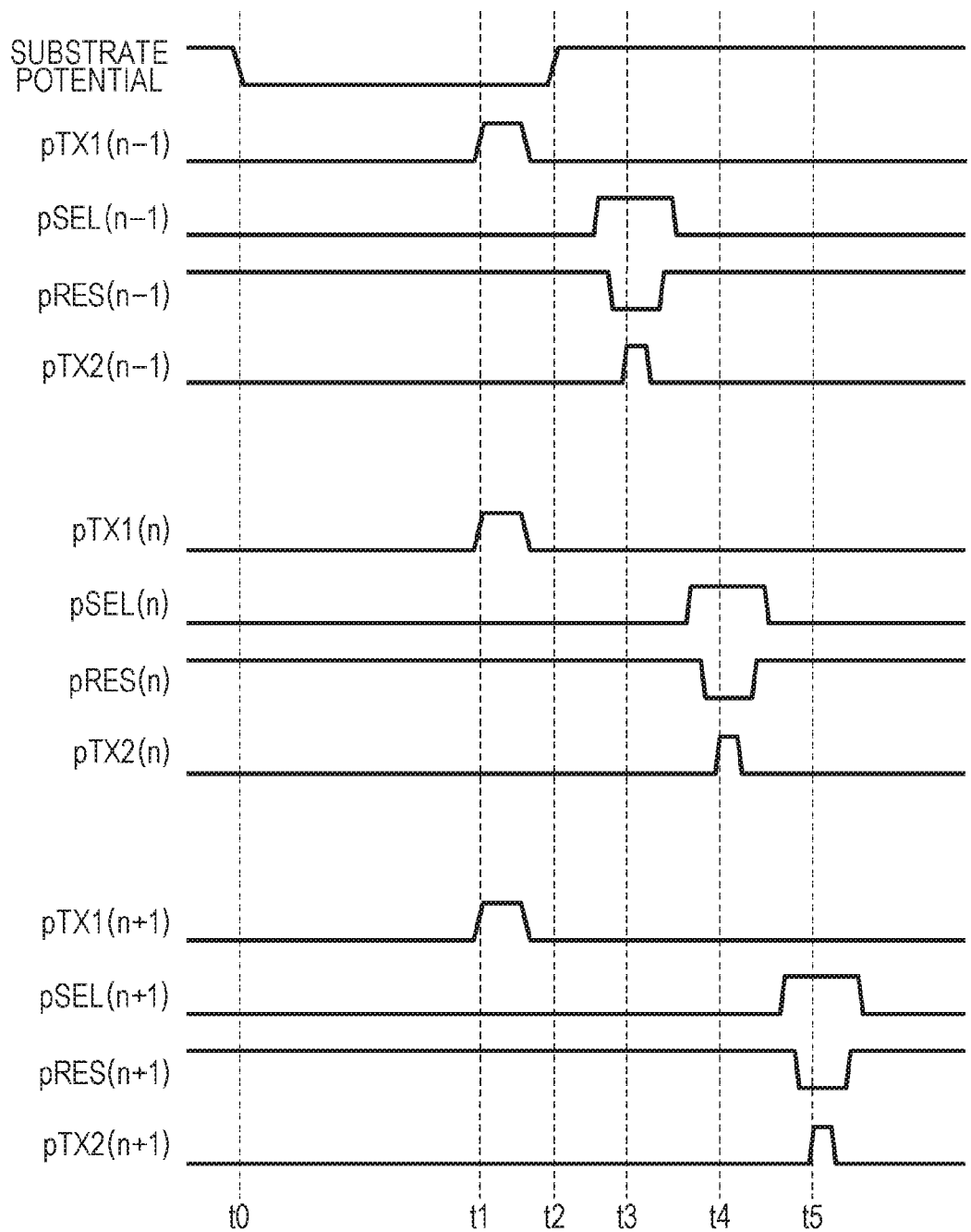
FIG. 4 is a driving timing chart according to the first embodiment of the present invention.

A first embodiment of the present invention will be described with reference to FIG. 1 to FIG. 4 and FIG. 11. FIG. 1 is a plan view of a plurality of pixels arranged in a 3×3 matrix form. FIG. 2 is a cross section view of pixels of a part taken at line II-II in FIG. 1. FIG. 3 is an equivalent circuit diagram illustrating pixels in three rows and three columns corresponding to FIG. 1. FIG. 4 is a driving timing chart for operating a solid-state image pickup device according to this embodiment. Like numbers refer to like parts throughout. Positive holes may be used as signal electric carriers though a configuration in which electrons are used as signal electric carriers will be described below. When positive holes are used as signal electric carriers, the conductivity type of semiconductor regions may be opposite to the conductivity type in a case where signal electric carriers are electrons.

Referring to FIG. 3, each of pixels P1 includes a first transfer transistor 14 configured to transfer electric carriers in a photoelectric converting unit 1, and an electric carrier accumulating portion 3 configured to accumulate electric carriers transferred from the first transfer transistor 14. Each of the pixels P1 further includes a second transfer transistor 15 configured to transfer electric carriers from the electric carrier accumulating portion 3. Each of the pixels P1 further includes a floating diffusion 6 (hereinafter, called an "FD 6") configured to accumulate electric carriers transferred from the second transfer transistor 15, a reset transistor 16 configured to reset the potential of the FD 6, a source follower transistor 17, and a row selection transistor 18.

Each of the pixels P1 is connected to a vertical output line Vout through a pixel output unit 22. A power supply 20, and a ground 21 are further provided therein. According to this embodiment, a configuration called a Vertical Overflow Drain (hereinafter, VOFD) is provided in which electric carriers are output from the photoelectric converting unit 1 to the semiconductor substrate 7 through an embedded layer 9.

FIG. 2 is a pixel cross section view taken at line II-II in FIG. 1. A p-type embedded layer 9 and a p-type well 8 are provided on an n-type semiconductor substrate 7. The surface protective layer 2 is provided on the photoelectric converting unit 1 having the n-type and the p-type so that a so-called buried type photodiode can be configured. A p-type surface protective layer 4 is provided on an n-type electric carrier accumulating portion 3.

A depleting inhibiting portion 5 is provided under the p-type electric carrier accumulating portion 3, and the depleting inhibiting portion 5 is made of a higher density semiconductor than that of the well 8.

Supply of pulses which turns on the first transfer transistor 14 to TX1 being a gate of the first transfer transistor 14 causes electric carriers in the photoelectric converting unit 1 to be transferred to the electric carrier accumulating portion 3.

Supply of pulses which turns on a second transfer transistor 15 to TX2 being a gate of the second transfer transistor 15 causes electric carriers accumulated in the electric carrier accumulating portion 3 to be transferred to the FD 6.

Next, with reference to FIGS. 3 and 4, operations to be performed by the solid-state image pickup device according to this embodiment will be described. Referring to FIG. 4, transistors having a low level (hereinafter, called an L level) have a non-conductive state, and transistors having a high level (hereinafter, called an H level) have a conductive state.

Referring to FIGS. 3 and 4, pTX1(*n*) indicates a gate drive line of the first transfer transistor 14 of an nth row, and pTX2(*n*) indicates a gate drive line of the second transfer transistor 15 of the nth row. pRES(n) indicates a gate drive line of the reset transistor 16 of the nth row, and pSEL(n) indicates a gate drive line of the row selection transistor 18 of the nth row. A number within each of the parentheses after names of gate drive lines indicates the row number of pixels.

At a time t0 in FIG. 4, the level of the substrate potential is changed to an L level so that VOFD is turned off. Thus, accumulation of electrons having undergone photoelectric conversion in the photoelectric converting unit 1 is started.

Next, at a time t1, the levels of the gate drive lines pTX1(*n*−1), pTX1(*n*), and pTX1(*n*+1) for the first transfer transistors 14 are changed to an H level so that the first transfer transistors 14 are turned on. Thus, electrons are transferred to the electric carrier accumulating portion 3. After a lapse of a predetermined time period, the first transfer transistors 14 are turned off so that the transfer of electrons to the electric carrier accumulating portions 3 ends.

Because the electric carrier accumulating portions 3 are provided in this embodiment, signal electric carriers in the photoelectric converting units 1 in all pixels are simultaneously transferred to the electric carrier accumulating portions 3. This can implement an operation to be performed by a global electronic shutter which controls an exposure start and an exposure end simultaneously in all pixels through an electronic switch.

Next, at a time t2, the level of the substrate potential is changed to an H level so that a punch-through occurs between the photoelectric converting units 1 and the semiconductor substrate 7. Thus, electric carriers are output to the semiconductor substrate 7.

The period from the time t0 when VOFD is turned off to the time t1 when the first transfer transistors 14 are turned on may be set as required so that an image for an arbitrary accumulation time can be obtained.

The first transfer transistors may be turned on a plurality of number of times intermittently between the time t0 and the time t1. The turning on a plurality of number of times can reduce the signal electric carriers to be handled by one transfer operation and can facilitate the transfer operation. In a case with the turning on a plurality of number of times, the time t1 is a time for the last one of the plurality of ON operations.

Next, at times t3, t4, and t5, the level of the gate drive line pTX2 of the second transfer transistor 15 is changed to an H level line-sequentially so that the second transfer transistor 15 is turned on. Thus, signal electric carriers are transferred from the electric carrier accumulating portion 3 to the FD 6.

A conventional method for a CMOS image sensor is applicable as a signal transfer method for the FD 6 and subsequent stages. In other words, signals are output to the vertical signal lines via the source follower transistor 17, the row selection transistor 18, and the pixel output unit 22. A signal of a noise component may be output to the vertical signal line before the second transfer transistor 15 is turned on. Though the row selection transistor 18 is provided in FIG. 3, a configuration without the row selection transistor 18 may be applied.

The gate drive lines here are made of conductors to transmit drive pulses illustrated in FIG. 4, and a parasitic capacitance is formed between the conductors. The parasitic capacitance and an electric resistance of the conductors cause a propagation delay between drive pulses being transmitted through the conductors. As the number of pixels in the solid-state image pickup device increases, the size of the image sensing region increases. Thus, the image sensing region may have a part having a smaller propagation delay and the other part having a larger propagation delay. As a result, this may cause differences in operating timing of drive pulses to be input to the gates of transistors in pixels within the image sensing region, which causes differences in timing for storing image signals accumulated in the photoelectric converting units 1. This may result in degradation of image quality.

With a conventional line-sequential shutter instead of a global electronic shutter, differences in accumulation timing within a screen may not be a significant problem in image quality because there are relatively large differences in accumulation timing within the screen. However, with a global electronic shutter, because a difference in accumulation timing for each row may not occur easily, the degradation of image quality due to the difference in accumulation timing caused by a propagation delay may be significant within an image sensing region. The ratio of a difference in accumulation timing to an accumulation time increases as the accumulation time decreases. Thus, the difference becomes more significant, which may possibly be one factor which prevents reduction of the accumulation time.

The accumulation timing in a global electronic shutter is controlled by the first transfer transistors 14 as described above. Thus, the parasitic capacitance of the gate drive line pTX1 for the first transfer transistor 14 may be reduced to reduce the propagation delays so that the difference in accumulation timing can be reduced within the image sensing region. Such an influence of the parasitic capacitance may significantly occur in a case where gate drive lines for a plurality of pixel transistors are provided within one wiring layer and the gate drive lines are positioned closely.

Positioning of pTX1

Next, with reference to FIG. 1, positioning of drive lines for pixel transistors for reducing parasitic capacitance of the gate drive line pTX1 will be described.

FIG. 1 illustrates semiconductor regions, gate electrodes of pixel transistors and wiring for electrically connecting the semiconductor regions and the gate electrodes of the pixel transistors in the photoelectric converting unit 1. In the solid-state image pickup device, lines including a power supply line, a ground power supply line, and a vertical output line in addition to the drive lines for pixel transistors are placed in a wiring layer including a plurality of layers as required. FIG. 1 illustrates the drive lines for pixel transistors placed within one wiring layer. For example, in a wiring layer having a three-layer structure, the drive lines for the pixel transistors illustrated in FIG. 1 are placed in the second wiring layer.

Referring to FIG. 1, gate drive lines for the first transfer transistor 14, second transfer transistor 15, and reset transistor 16 are provided on the electric carrier accumulating portion 3 so as to extend in the row direction of the image sensing region. Those gate drive lines are arranged in a periodical layout pattern.

The gate drive line pRES(n) for the reset transistor 16 is only provided in proximity of the gate drive line pTX1(n) and far away from the gate drive line pTX2(n+1) for the second transfer transistor 15. In this arrangement, pTX1(n) can have a lower parasitic capacitance compared with an arrangement in which gate drive lines for pixel transistors are closely provided on both sides of pTX1(n).

Figure 11:
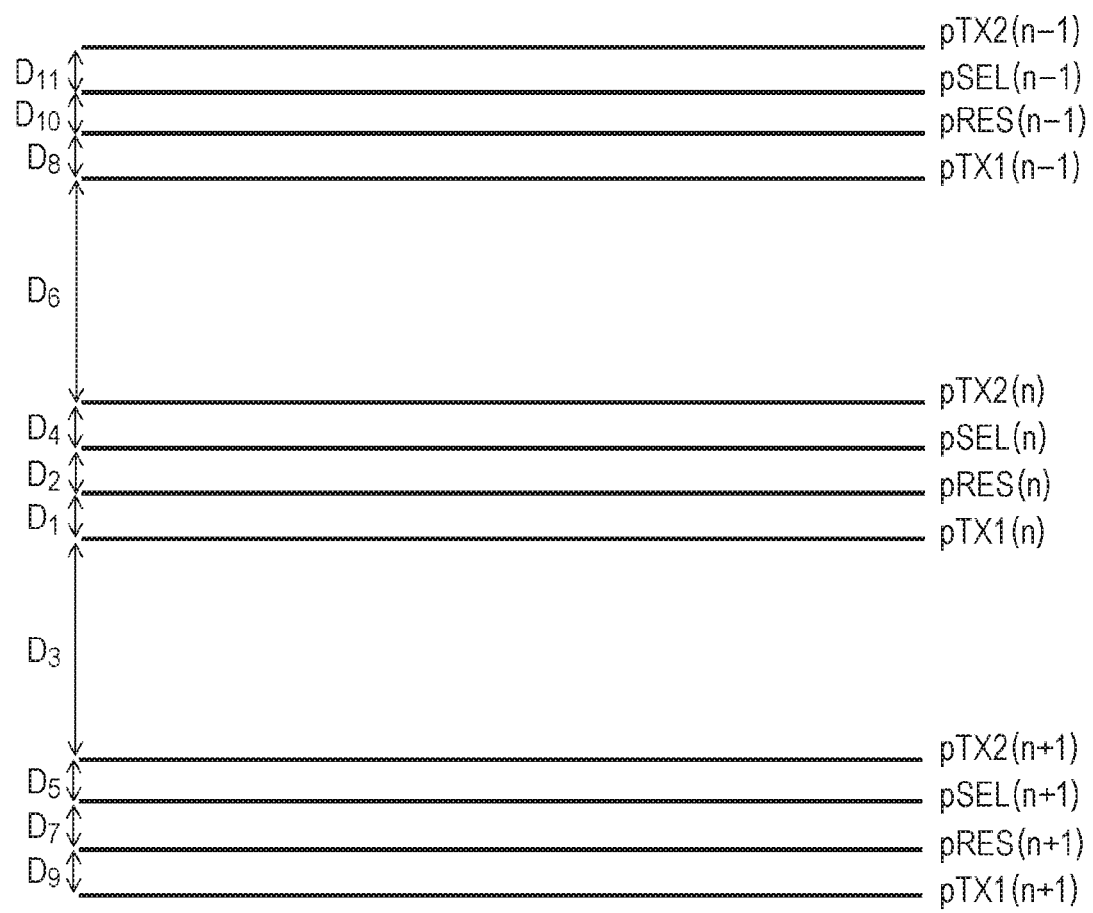
FIG. 11 is a schematic diagram regarding an example of arrangement of driving wiring according to the first embodiment of the present invention.

FIG. 11 schematically illustrates the arrangement of driving wiring illustrated in FIG. 1. Dx indicates a distance between drive lines.

It is assumed here that the total of a wiring distance between a gate drive line for a first transfer transistor and gate drive lines for pixel transistors provided on both sides of the gate drive line for the first transfer transistor in the driving wiring of the rows (n−1), the rows (n), and rows (n+1) is equal to $DTX1_{Total}$.

Similarly, the totals of a wiring distance between a gate drive line for other pixel transistors excluding the first transfer transistor and gate drive lines for the pixel transistors provided on both sides of the gate drive line are equal to $DTX2_{Total}$ for a second transfer transistor, $DRES_{Total}$ for a reset transistor, and $DSEL_{Total}$ for a row selection transistor.

In this case, $DTX1_{Total}$ is a value higher than all of $DTX2_{Total}$, $DRES_{Total}$, and $DSEL_{Total}$.

Referring to FIG. 11, it is assumed that the intervals between drive lines of rows (n−1), rows (n), rows (n+1) are equal to $D_1$ to $D_{11}$, respectively.

Here, in the driving wiring of the rows (n−1), rows (n), and rows (n+1), $DTX1_{Total}$ is equal to $D_1+D_3+D_6+D_8+D_9$. On the other hand $DRES_{Total}$ is equal to $D_1+D_2+D_7+D_8+D_9+D_{10}$. $DSEL_{Total}$ is equal to $D_2+D_4+D_5+D_7+D_{10}+D_{11}$.

Figure 12:
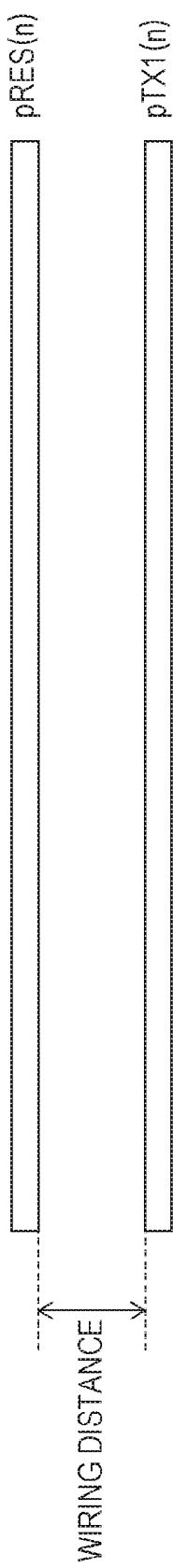
FIG. 12 is an explanatory diagram of a wiring distance.

Because $D_3$ and $D_6$ are three times or more of the interval between other lines, for example, $DTX1_{Total}$ is equal to a value higher than $DRES_{Total}$ and $DSEL_{Total}$ in rows (n−1), rows (n), and rows (n+1). It should be noted that the wiring distance between drive lines is defined herein by a distance between an end portion of pTX1(n) and an end portion of pRES(n), for example, as illustrated in FIG. 12.

According to the configuration as described above, the parasitic capacitance occurring in the gate drive line pTX1 can be reduced, and a smaller propagation delay as a result can reduce the differences in accumulation timing.

The positioning of drive lines as described above can be applied not only to front side illumination (FSI) but also back side illumination (BSI). Also for back side illumination, it is assumed that drive lines for pixel transistors are placed correspondingly to rows of pixels. Thus, the drive line positioning example as described above may be applied in that case.

FIG. 1 illustrates a plan view of pixels of front side illumination. In front side illumination, a drive line for each pixel transistor is generally arranged in a region without a photoelectric converting unit. For example, referring to FIG. 1, a gate drive line for each pixel transistor is placed on the electric carrier accumulating portion. Therefore, in consideration of the layout of drive lines, the gate drive line pTX1 of gate drive lines for pixel transistors are arranged in proximity of the photoelectric converting unit 1 for the purpose of reduction of parasitic capacitance of the gate drive line pTX1 for the first transfer transistor 14. As a result, the gate drive line pTX1 is placed at an end portion of the drive line region, and the gate drive line pTX1 has a conductor only in one side of the drive line region.

Positioning of pTX1 and pTX2

According to this embodiment, the gate drive line pTX1 and the gate drive line pTX2 are not positioned in proximity of each other. The expression "not positioned in proximity of each other" refers to a positional relationship in which pTX2 is not placed on both sides of pTX1. Alternatively, even in a case where pTX2 is placed on one side of pTX1, the distance between pTX1 and pTX2 is three times or more, for example, of the distance between pTX1 and a drive line placed on the other side of pTX1.

Problems involved in a case where the gate drive line pTX1 and the gate drive line pTX2 are placed in proximity of each other will be described below.

When the gate drive line pTX1 and the gate drive line pTX2 have capacitive coupling, the potential of the gate drive line pTX2 may have a fluctuation when the level of the gate drive line pTX1 changes. For example, at the time t1 illustrated in FIG. 4, the level of the gate drive line pTX2 is originally an L level. However, when the gate drive line pTX1 is changed from an L level to an H level, the potential of the gate drive line pTX2 is changed from an L level to an H level. This lowers the potential barrier from the electric carrier accumulating portion 3 to the FD 6. Thus, the saturation signal amount in the electric carrier accumulating portion 3 can be reduced. The influence of the potential fluctuations depending on the variation of parasitic capacitance within the image sensing region may cause fluctuations of the saturation signal amount in the electric carrier accumulating portion 3 within the image sensing region. This phenomenon becomes more significant when the operation of the gate drive line pTX1 is performed a plurality of number of times intermittently between the time t0 to the time t1.

In some cases, the gate drive line pTX2 may be set to a negative potential during a period when the second transfer transistor 15 being an NMOS has an OFF state. Thus, holes are excited in a channel part so that re-coupling between electrons and holes can inhibit dark current even when electrons occur. If the gate drive line pTX1 and the gate drive line pTX2 have capacitive coupling here, the potential of the gate drive line pTX2 changes to be higher and the hole excitation can be insufficient when the level of the gate drive line pTX1 is changed from an L level to an H level. As a result, the dark current inhibition may possibly become insufficient.

In order to prevent this, the gate drive line pTX1 and the gate drive line pTX2 are not positioned in proximity of each other according to this embodiment. Particularly, referring to FIG. 1 and FIG. 11, in driving wiring of rows (n−1), rows (n), and rows (n+1), a maximum wiring distance of wiring distances between gate drive lines for pixel transistors can be the wiring distance between the gate drive line pTX1 and the gate drive line pTX2.

As understood from FIG. 4, when the first transfer transistor is turned on, the reset transistor also has an ON state. Thus, a change in potential of the reset transistor from an L level to an H level if any may not easily have an influence. Therefore, the gate drive line pRES can be positioned in proximity of the gate drive line pTX1.

The gate drive line pSEL may be positioned in proximity of the gate drive line pTX1 instead of the gate drive line pRES. This is because, even when the row selection transistor has an OFF state when the first transfer transistor is turned on, no transfer path for signal electric carriers exists if the constant current source has an OFF state and no variations in signals occur within the image sensing region.

Alternatively, a power supply line or a ground line instead of the gate drive line pRES may be positioned in proximity of the gate drive line pTX1 to inhibit a potential fluctuation. This is because such a power supply line and a ground line are not directly associated with the transfer path for signal electric carriers and no variations in signals occur within the image sensing region.

According to this embodiment, the FD 6 is provided in each pixel. However, the FD 6 may be shared by a plurality of pixels. Also in this case, the gate drive line pTX1 for the first transfer transistor may be positioned as described above to acquire the same effect. Sharing the FD 6 by a plurality of pixels can reduce the number of drive lines so that the gate drive line pTX1 for the first transfer transistor can be provided far away from other drive lines and the parasitic capacitance can thus be reduced.

Second Embodiment

Figure 5:
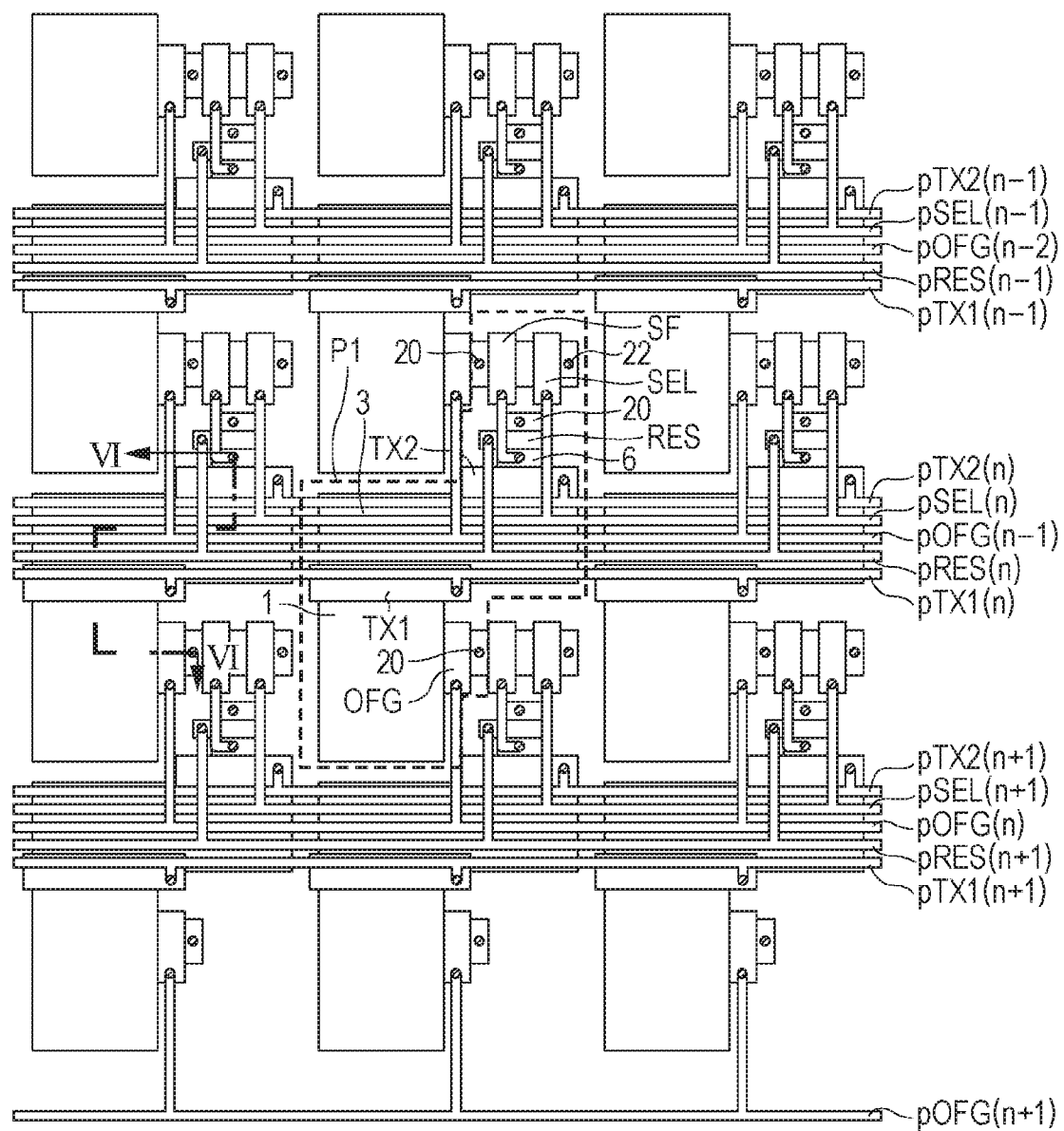
FIG. 5 is a plan view of pixels according to a second embodiment of the present invention.
Figure 6:
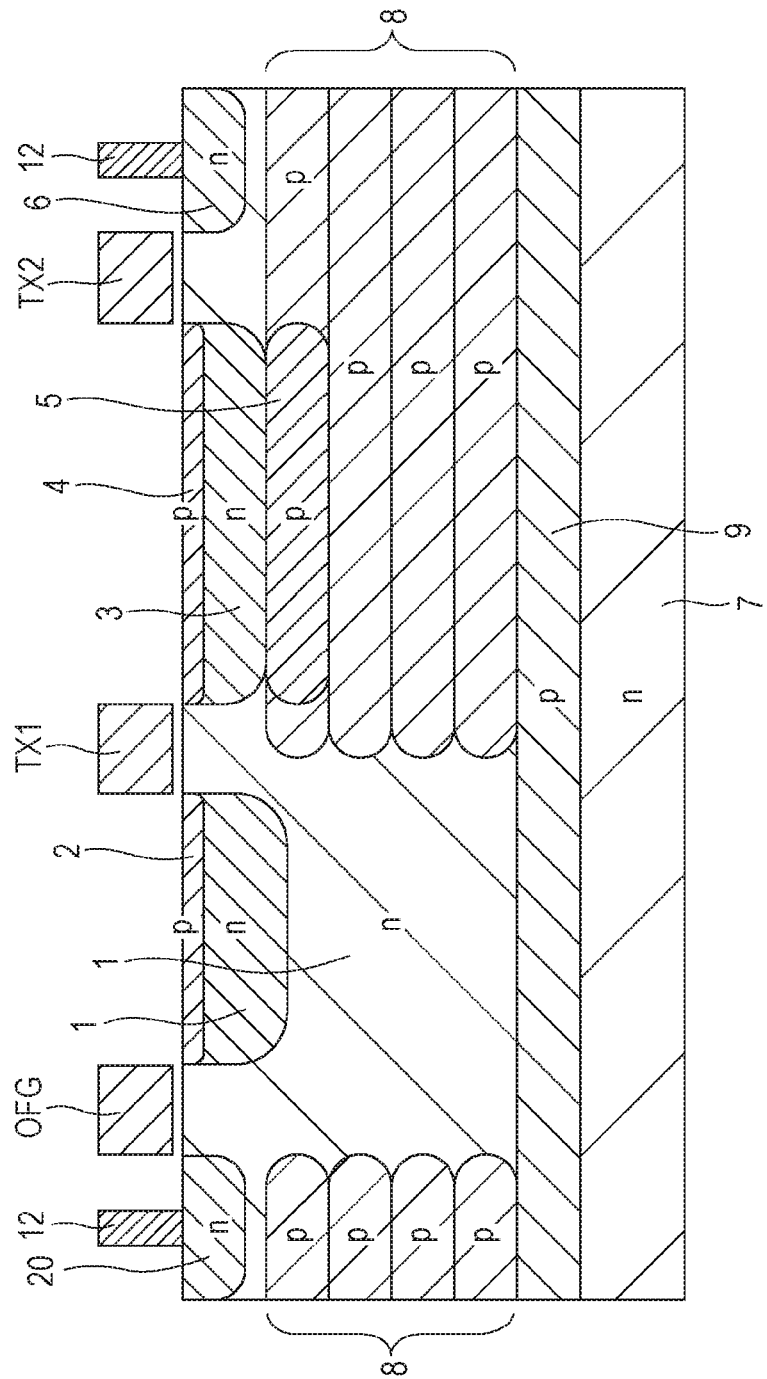
FIG. 6 is a cross section view according to the second embodiment and third and fourth embodiments of the present invention.
Figure 7:
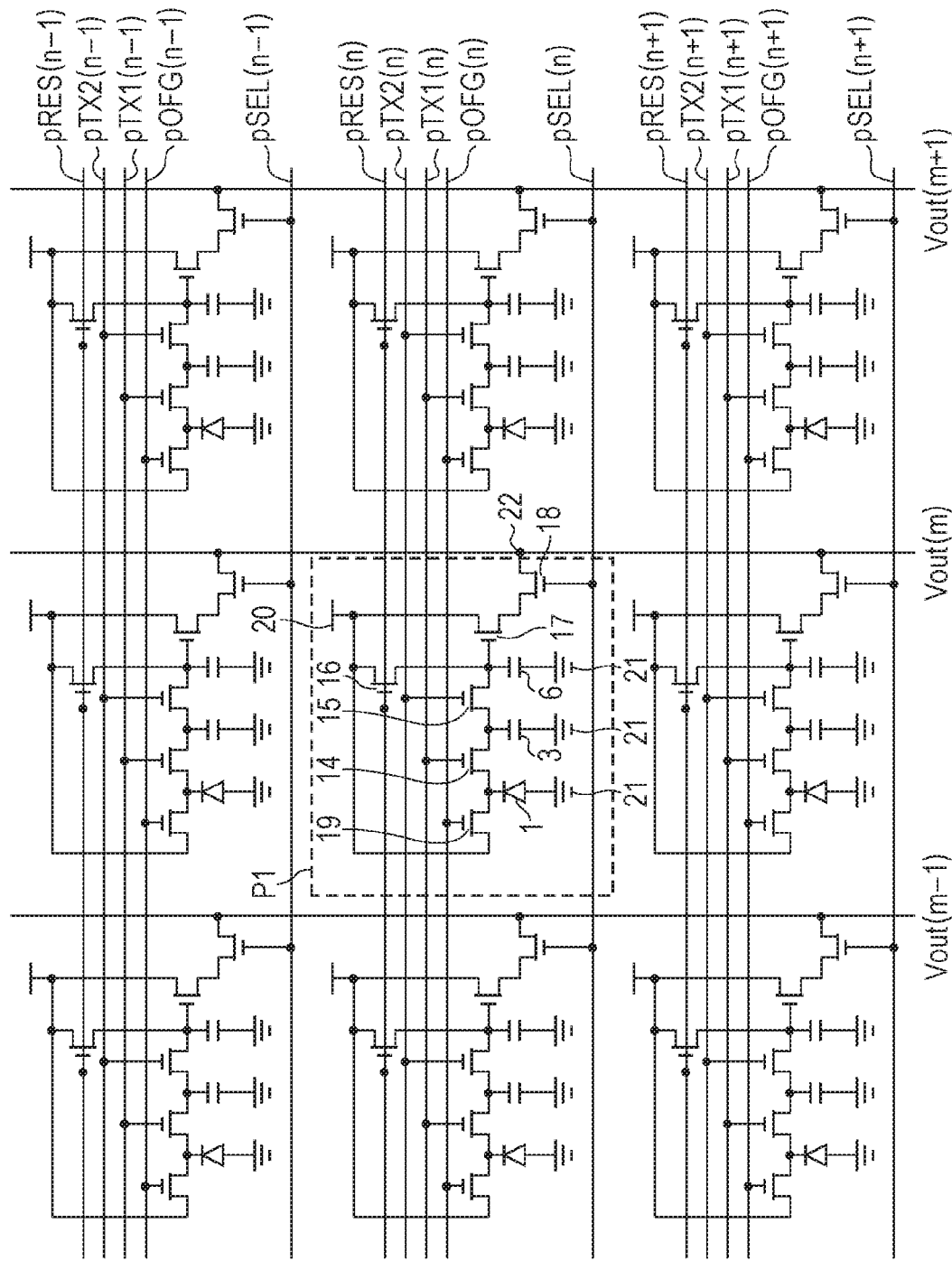
FIG. 7 is a pixel circuit diagram according to the second, third and fourth embodiments of the present invention.
Figure 8:
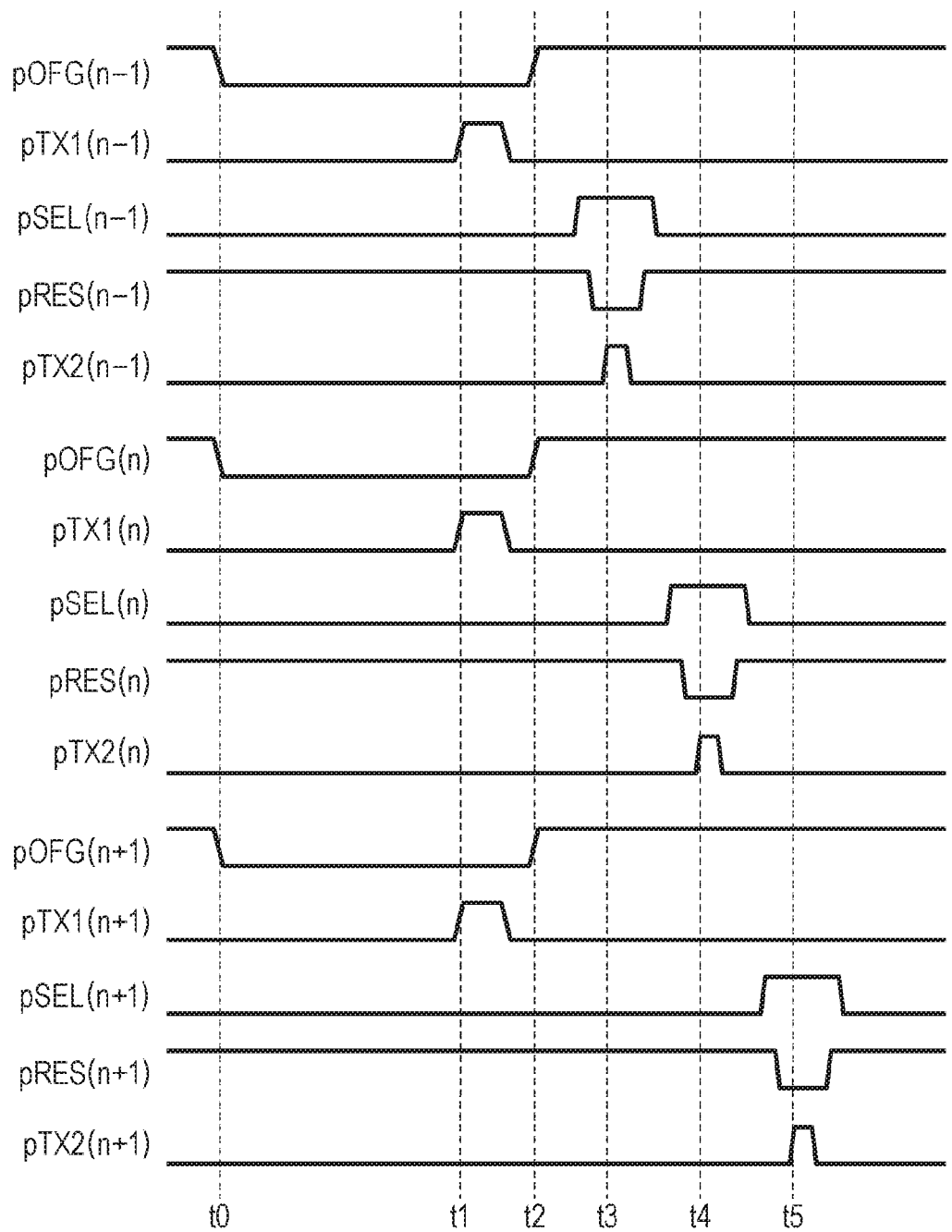
FIG. 8 is a driving timing chart according to the second, third and fourth embodiments of the present invention.

A second embodiment of the present invention will be described with reference to FIG. 5 to FIG. 8 and FIG. 13. Like numbers refer to like parts throughout in the first and second embodiments, and detail descriptions will be omitted. FIG. 5 is a plan view of pixels of three rows and three columns in a solid-state image pickup device according to this embodiment. FIG. 6 is a pixel cross section view of a part taken at the line VI-VI in FIG. 5. FIG. 7 is an equivalent circuit diagram illustrating pixels of three rows and three columns corresponding to FIG. 5. FIG. 8 is a driving timing chart for operating the solid-state image pickup device according to this embodiment.

This embodiment is different from the first embodiment in that an overflow transistor is separately provided without applying a VOFD configuration. In other words, as illustrated in FIGS. 6 and 7, an overflow transistor 19 is provided. When a gate OFG of the overflow transistor is turned on, electric carriers are transferred to a power supply 20 through a plug 12.

FIG. 8 illustrates a timing chart. At a time t0, the level of the gate drive line pOFG for the overflow transistor 19 is changed to an L level so that the overflow transistor 19 is turned off.

Next, at a time t1, the level of the gate drive line pTX1 for the first transfer transistor 14 is changed to an H level, and the first transfer transistor 14 is turned ON. Thus, electrons are transferred to the electric carrier accumulating portion 3. After a lapse of a predetermined time period, the first transfer transistor 14 is turned off so that the transfer of electrons to the electric carrier accumulating portion 3 ends.

Next, at a time t2, the level of the gate drive line pOFG is changed to an H level so that the overflow transistor 19 is turned on. Thus, electric carriers can be output from the photoelectric converting unit 1 to the power supply 20 which is an overflow drain.

The period from the time t0 when the change of the level of the gate drive line pOFG to the L level to the time t1 when the first transfer transistor 14 is turned on may be set as required so that an image for an arbitrary accumulation time can be obtained.

Figure 13:
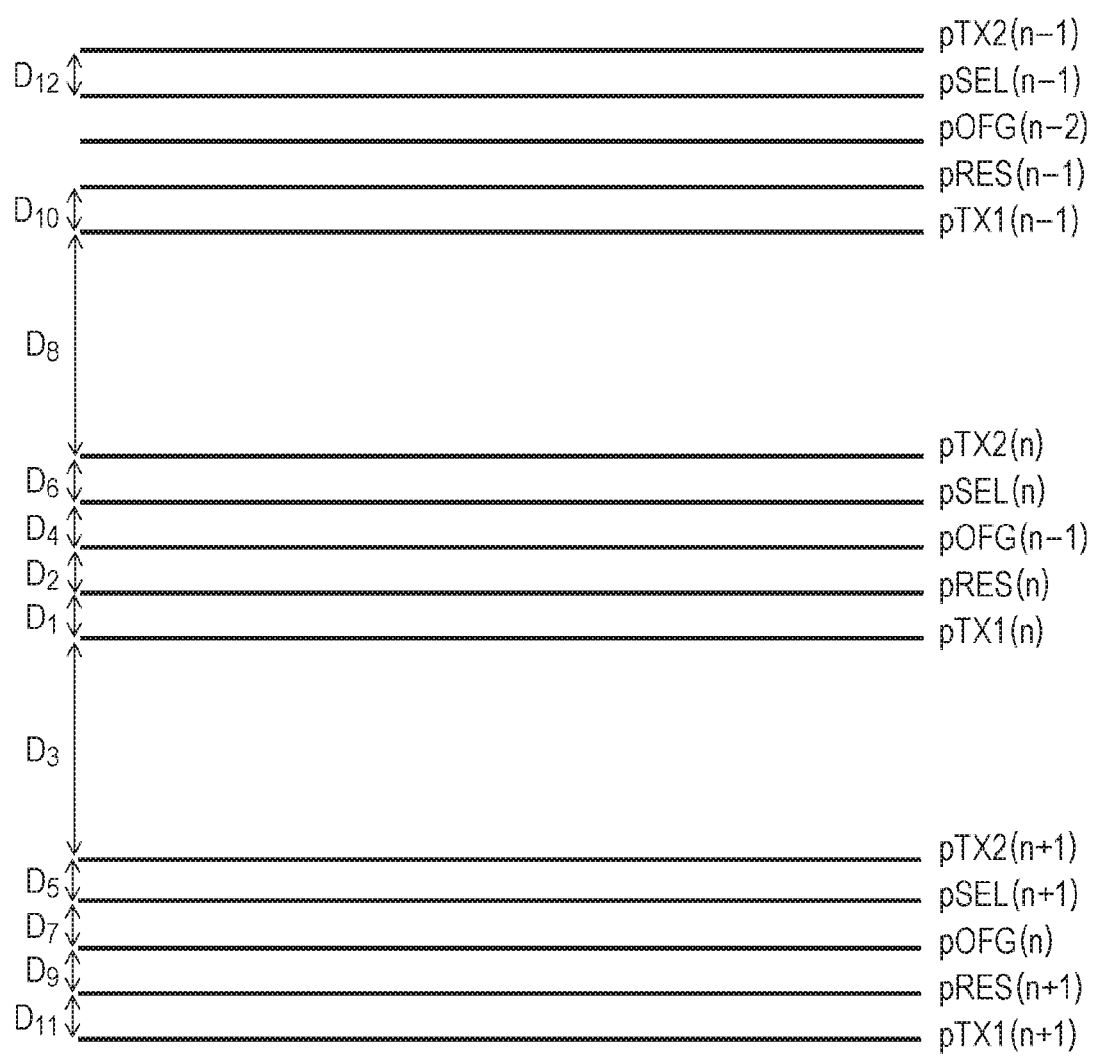
FIG. 13 is a schematic diagram regarding an example of arrangement of driving wiring according to the second embodiment of the present invention.

FIG. 13 schematically illustrates an arrangement of driving wiring illustrated in FIG. 5. It is assumed that intervals between drive lines of rows (n−1), rows (n), and rows (n+1) are equal to $D_1$ to $D_{12}$, respectively. It should be noted that the interval between pOFG(n−2) and an adjacent drive line is not considered because pOFG(n−2) is a drive line for pixels of the (n−2)th row. pOFG(n+1), not illustrated, is not also considered because it is positioned between pRES(n+2) and pSEL(n+2).

Here, in rows (n−1), rows (n), rows (n+1), $DTX1_{Total}$ is equal to $D_1+D_3+D_8+D_{10}+D_{11}$. On the other hand, $DRES_{Total}$ is equal to $D_1+D_2+D_9+D_{10}+D_{11}$. $DSEL_{Total}$ is equal to $D_4+D_5+D_6+D_7+D_{12}$. $DOFG_{Total}$ is equal to $D_2+D_4+D_7+D_9$.

Because $D_3$ and $D_8$ are three times or more of the interval between other lines, for example, $DTX1_{Total}$ is equal to a value higher than $DRES_{Total}$, $DSEL_{Total}$, and $DOFG_{Total}$ in the rows (n−1), rows (n), rows (n+1). According to the configuration, the parasitic capacitance occurring in the gate drive line pTX1 can be reduced, and a smaller propagation delay as a result can reduce the differences in accumulation timing.

This wiring arrangement can be expressed as that pTX1 and pTX2 are not positioned in proximity of each other. Furthermore, the distance between pTX1 and pTX2 in rows (n−1), rows (n), and rows (n+1) can be expressed as a maximum wiring distance of wiring distances between gate drive lines for pixel transistors.

Positioning of pTX1 and pOFG

A problem may possibly arise when the gate drive line pTX1 and the gate drive line pOFG have capacitive coupling. In other words, at a time t1 in FIG. 8 when the level of the gate drive line pTX1 is changed from an L level to an H level, the level of the gate drive line pOFG is an L level. However, when the gate drive line pTX1 and the gate drive line pOFG have capacitive coupling, the potential of the gate drive line pOFG may have a change from an L level to an H level at the time t1. Thus, the potential barrier from the photoelectric converting unit 1 to the power supply 20 being an overflow drain is reduced, and electrons are transferred from the photoelectric converting unit 1 to the power supply 20 so that the saturation signal amount in the photoelectric converting unit 1 may possibly decrease. This may cause variations of signals within the image sensing region.

Accordingly, as illustrated in FIG. 5 and FIG. 13, a drive line pRES is provided between the gate drive line pTX1 and the gate drive line pOFG in one driving wiring region so that the drive lines are positioned in proximity of each other, according to this embodiment.

This embodiment applies overflow transistors while the first embodiment applies a VOFD configuration. Application of the deeper photoelectric converting unit 1 in order to increase the sensitivity on a longer wavelength side makes output of electric carriers difficult with the VOFD configuration. However, also in this case, overflow transistors may be applied so that electric carriers can be output. In the VOFD configuration, a punch-through occurs between the photoelectric converting unit 1 and the semiconductor substrate 7. Thus, the embedded layer 9 may be required to be made of a low density semiconductor to some extent. On the other hand, with application of overflow transistors, the embedded layer 9 may be made of a high density semiconductor. This may improve the sensitivity of the photoelectric converting unit 1 and improve the efficiency of transfer to the electric carrier accumulating portion 3.

On the other hand, because application of a VOFD configuration eliminates the necessity for the gate OFG and gate drive line pOFG for an overflow transistor, the empty region may be allocated to other components. For example, the intervals between drive lines can be increased while keeping the same size of the photoelectric converting unit 1. Thus, the parasitic capacitance of the gate drive line pTX1 for the first transfer transistor can be further reduced compared with the first embodiment. The area of the photoelectric converting unit 1 may be increased so that the saturation charge quantity of the photoelectric converting unit 1 can be increased, and its sensitivity can be increased.

Third Embodiment

A third embodiment of the present invention will be described with reference to FIGS. 6, 7, 9, and 14. Like numbers refer to like parts throughout in the first, second and third embodiments, and detail descriptions will be omitted.

Figure 9:
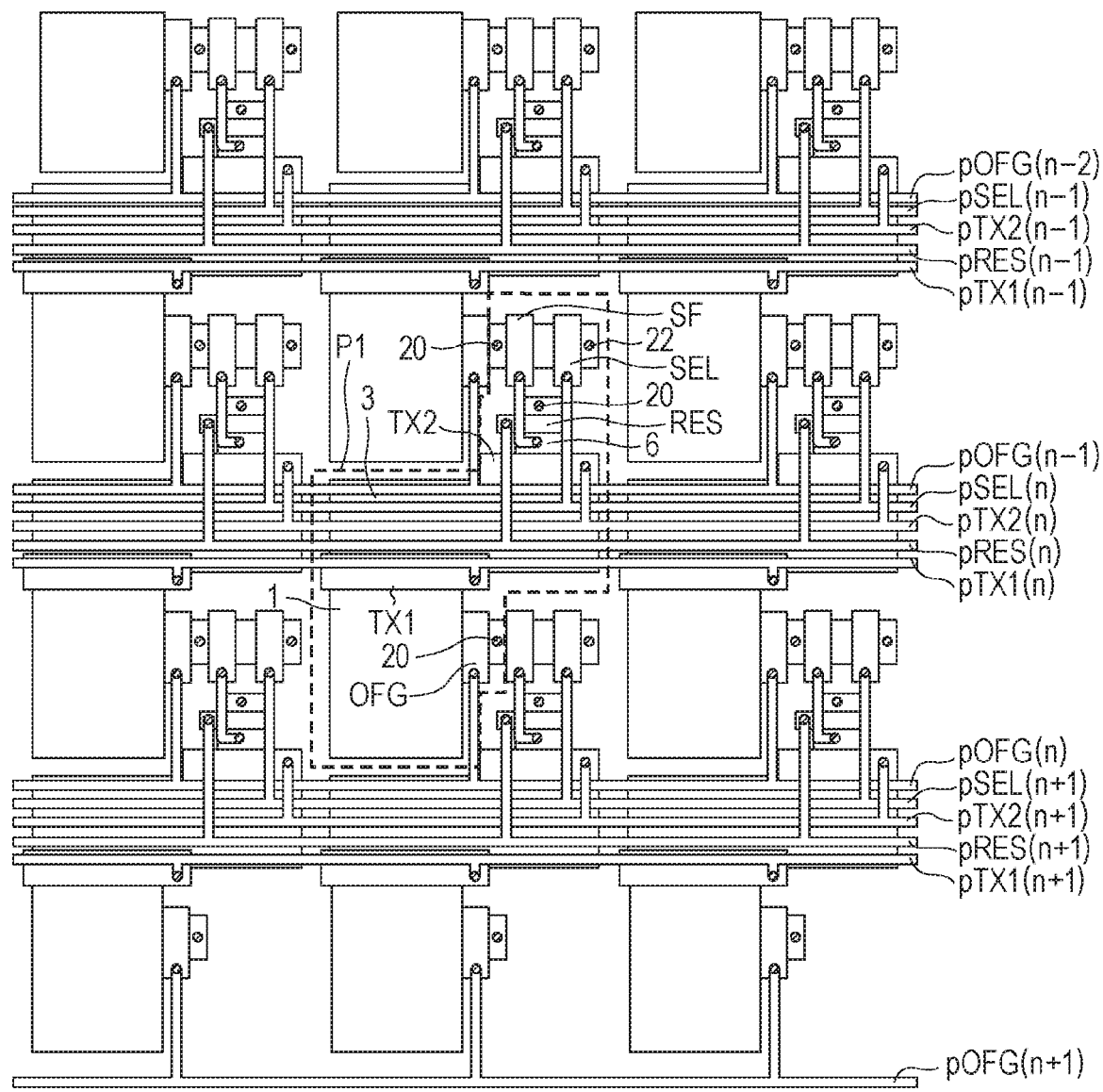
FIG. 9 is a plan view of pixels according to the third embodiment of the present invention.

FIG. 9 is a plan view illustrating pixels of three rows and three columns in a solid-state image pickup device according to this embodiment. The third embodiment is different from the second embodiment in the positions where the gate drive line pOFG and the gate drive line pTX2 are provided.

Referring to FIG. 9, the wiring distance between the gate drive line pTX1 and the gate drive line pOFG is a maximum wiring distance of wiring distances between gate drive lines for pixel transistors. This arrangement can reduce not only the parasitic capacitance of the gate drive line pTX1 and other gate drive lines but also the parasitic capacitance of the gate drive line pOFG and other gate drive lines.

The accumulation timing with a global electronic shutter can be controlled also by an input of drive pulses to a gate OFG of the overflow transistor 19, as described above. Therefore, the parasitic capacitance of the gate drive line pOFG for the overflow transistor 19 can be reduced, and a propagation delay occurring therein can be reduced. As a result, the difference in accumulation timing can be reduced.

According to this embodiment, the gate drive line pOFG and the gate drive line pTX2 are not positioned in proximity. If they are positioned in proximity, the saturation signal amount in the electric carrier accumulating portion 3 can be reduced, which may cause variations in saturation signal amount in the electric carrier accumulating portion 3 within the image sensing region.

In some cases, the gate drive line pTX2 may be set to a negative potential during a period when the gate drive line pTX2 for the second transfer transistor 15 being an NMOS has an OFF state. Thus, holes are excited in a channel part, and re-coupling of electrons and holes is thus caused, which can inhibit dark current. If the gate drive line pOFG and the gate drive line pTX2 have capacitive coupling here, the potential of the gate drive line pTX2 changes to be higher at a time point when the level of the gate drive line pOFG is changed from an L level to an H level. As a result, the inhibition of dark current may possibly in sufficient.

Accordingly, a gate drive line pRES for a reset transistor is positioned between the gate drive line pOFG and the gate drive line pTX2 in one driving wiring region. A gate drive line pSEL for a row selection transistor, a power supply line, a ground line or the like may be positioned instead of the gate drive line pRES.

Figure 14:
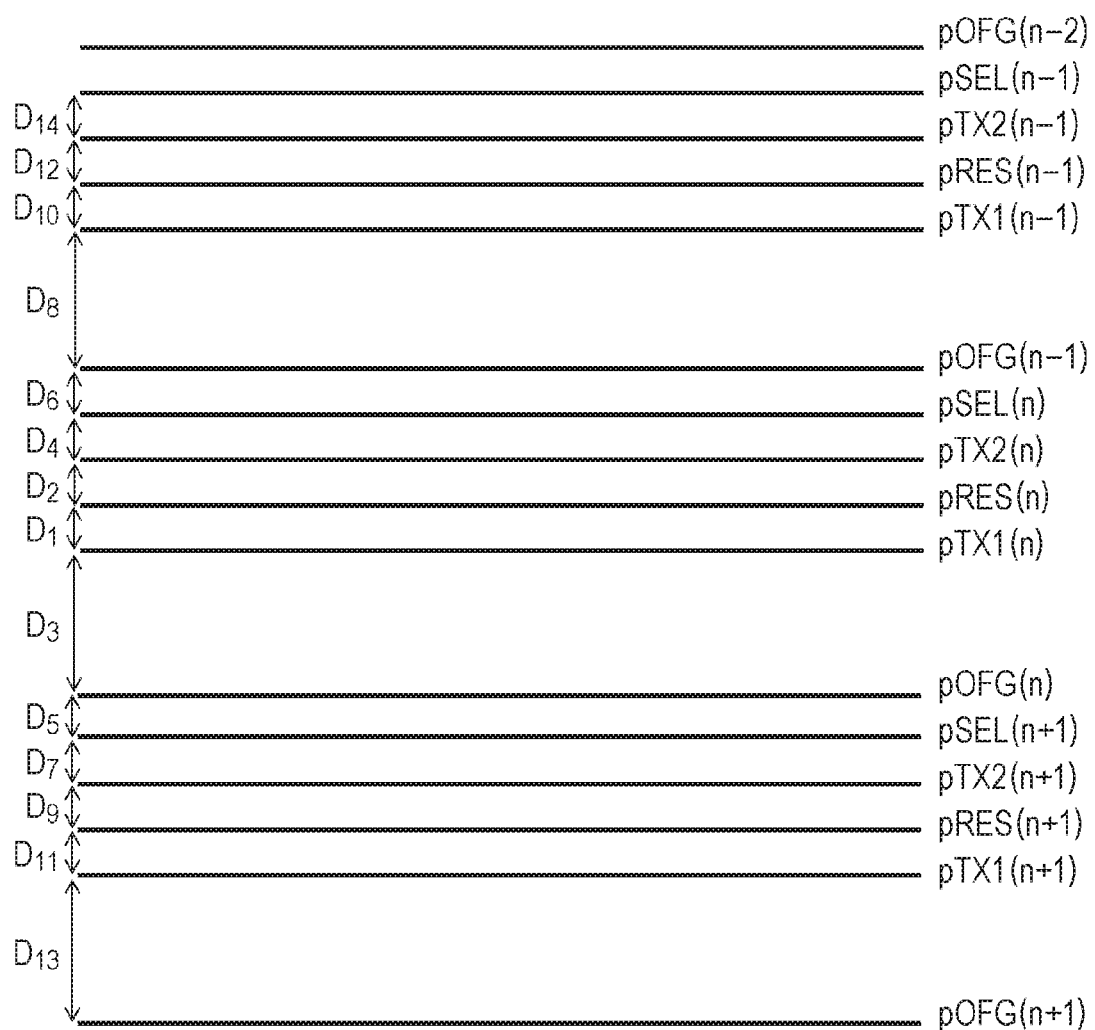
FIG. 14 is a schematic diagram regarding an example of arrangement of driving wiring according to the third embodiment of the present invention.

FIG. 14 schematically illustrates an arrangement of driving wiring illustrated in FIG. 9.

In this case, in driving wiring of rows (n−1), rows (n), and rows (n+1), $DTX1_{Total}$ is equal to $D_1+D_3+D_8+D_{10}+D_{11}+D_{13}$. On the other hand, $DRES_{Total}$ is equal to $D_1+D_2+D_9+D_{10}+D_{11}+D_{12}$. $DSEL_{Total}$ is equal to $D_4+D_5+D_6+D_7+D_{14}$. Furthermore, $DTX2_{Total}$ is equal to $D_2+D_4+D_7+D_9+D_{12}+D_{14}$.

Because $D_3$, $D_8$, and $D_{13}$ are three times or more of the interval between other lines, for example, $DTX1_{Total}$ is a value higher than $DRES_{Total}$, $DSEL_{Total}$, and $DTX2_{Total}$ in rows (n−1), rows (n), and rows (n+1).

For the reason above, pTX1 and pOFG are not positioned in proximity as illustrated in FIG. 14, pTX2 and pOFG are not positioned in proximity, and pTX1 and pTX2 are not positioned in proximity.

Furthermore, pOFG is positioned in proximity to the photoelectric converting unit 1.

In addition, as described above, the wiring distance between pTX1 and pOFG is a maximum wiring distance of wiring distances between gate drive lines for pixel transistors.

Fourth Embodiment

A fourth embodiment of the present invention will be described with reference to FIGS. 6 to 8 and FIG. 10. Like numbers refer to like parts throughout in the first to fourth embodiments, and detail descriptions will be omitted.

Figure 10:
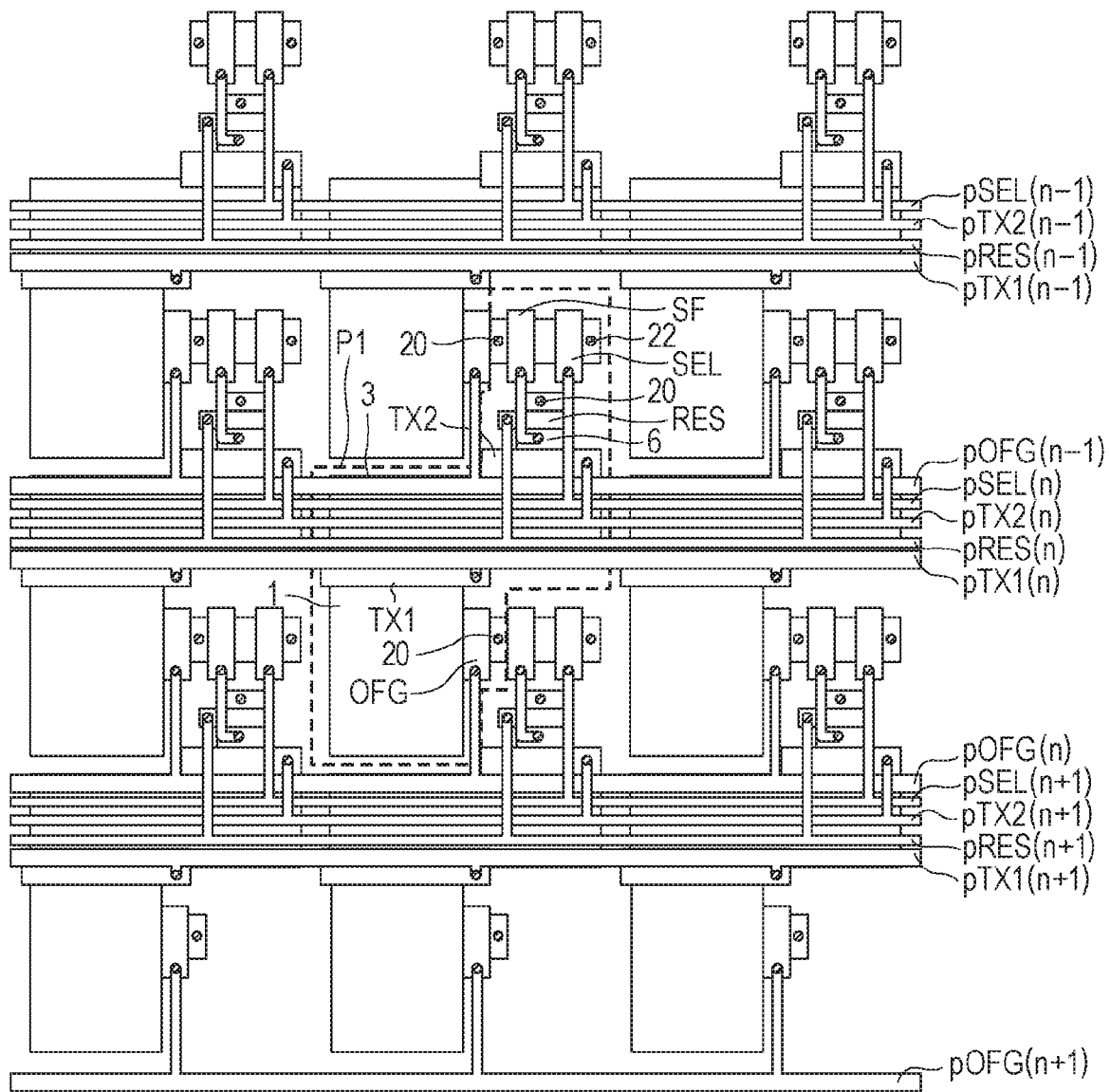
FIG. 10 is a plan view of pixels according to the fourth embodiment of the present invention.

FIG. 10 is a plan view illustrating pixels of three rows and three columns in a solid-state image pickup device according to this embodiment. The fourth embodiment is different from the second and third embodiments in that the line width of the gate drive line pOFG and the line width of the gate drive line pTX1 are greater than the line width of other drive lines. The positions of the drive lines are also changed as required.

A propagation delay of each drive pulse transmitted through a conductor can be expressed by a product of a parasitic capacitance and an electric resistance of the conductor. Thus, the electric resistance may be reduced to obtain the same effect as the reduction of the parasitic capacitance. In other words, the line width of the gate drive line pOFG and the line width of the gate drive line pTX1 may be increased to reduce the propagation delays and thus reduce the differences in accumulation timing.

Having described that according to this embodiment, the line widths of both of the gate drive line pOFG and the gate drive line pTX1 are increased, one of them may only be increased. Alternatively, one of them may further be increased.

Such a configuration with drive lines having increased line widths may require reduction of the width of a wiring open region where no drive lines are placed or and reduction of the intervals between drive lines while keeping the width of the wiring open region. For that, by examining the effect of the reduction of parasitic capacitance and the effect of the reduction of electric resistance, one of the configurations with a greater effect may be selected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus having a pixel array in which a plurality of pixel rows each including a plurality of pixels arranged in a second direction is arranged in a first direction perpendicular to the second direction, each of the plurality of pixel rows including:
    a photoelectric conversion unit;
    a first transfer transistor configured to transfer electric carriers in the photoelectric conversion unit to an electric carrier accumulating portion;
    a second transfer transistor configured to transfer electric carriers in the carrier accumulating portion to a floating diffusion; and
    a reset transistor configured to reset a potential of the floating diffusion,
    the photoelectric conversion apparatus comprising:
    a plurality of first gate drive lines arranged to extend in the second direction and configured to drive the first transfer transistor;
    a plurality of second gate drive lines arranged to extend in the second direction and configured to drive the second transfer transistor; and
    a plurality of third gate drive lines arranged to extend in the second direction and configured to drive the reset transistor,
    wherein a greatest line width of the first gate drive line corresponding to a first pixel row in the first direction, in a section from a portion where the first transfer transistor of a first pixel in the first pixel row is connected to the first gate drive line corresponding to the first pixel row to a portion where the first transfer transistor of a second pixel adjacent to the first pixel in the second direction is connected to the first gate drive line corresponding to the first pixel row, is greater than a greatest line width of a third gate drive line corresponding to the first pixel row in the first direction, in a section from a portion where the reset transistor of the first pixel is connected to the third gate drive line corresponding to the first pixel row to a portion where the reset transistor of the second pixel is connected to the third gate drive line corresponding to the first pixel row.

2. The photoelectric conversion apparatus according to claim 1,
    wherein each of the plurality of pixels arranged in the second direction includes an overflow transistor configured to discharge electric carriers in the photoelectric conversion unit,
    wherein the photoelectric conversion apparatus further includes a plurality of fourth gate drive lines arranged to extend in the second direction and configured to drive the overflow transistor,
    wherein a greatest line width of the fourth gate drive line corresponding to the first pixel row in the first direction, in a section from a portion where the fourth gate drive line corresponding to the first pixel row is connected to the overflow transistor of the first pixel in the first pixel row to a portion where the fourth gate drive line corresponding to the first pixel row is connected to the overflow transistor of the second pixel, is greater than a greatest line width of the third gate drive line corresponding to the first pixel row in the first direction, in a section from a portion where the third gate drive line corresponding to the first pixel row is connected to the reset transistor of the first pixel to a portion where the third gate drive line corresponding to the first pixel row is connected to the reset transistor of the second pixel.

3. The photoelectric conversion apparatus according to claim 1,
    wherein each of the plurality of pixels includes a source follower transistor electrically connected to the floating diffusion of at least one pixel in the first pixel row,
    wherein a line connecting the floating diffusion and a gate of the source follower transistor extends in the first direction, and
    wherein the greatest line width of the first gate drive line corresponding to the first pixel row in the first direction is greater than a greatest line width of the line in the second direction, in the section from the portion where the first gate drive line corresponding to the first pixel row is connected to the first transfer transistor of the first pixel to the portion where the first gate drive line corresponding to the first pixel row is connected to the first transfer transistor of the second pixel.

4. The photoelectric conversion apparatus according to claim 3, wherein the greatest line width of the fourth gate drive line corresponding to the first pixel row in the first direction is greater than the greatest line width of the line in the second direction, in the section from the portion where the fourth gate drive line corresponding to the first pixel row is connected to the overflow transistor of the first pixel to the portion where the fourth gate drive line corresponding to the first pixel row is connected to the overflow transistor of the second pixel.

5. The photoelectric conversion apparatus according to claim 1, further comprising a second pixel row adjacent to the first pixel row,
    wherein, in a planar view, the second gate drive line corresponding to the first pixel row is arranged closer to a plurality of photoelectric conversion units included in the second pixel row than the first gate drive line corresponding to the first pixel row.

6. The photoelectric conversion apparatus according to claim 1, wherein, in a planar view, the third gate drive lines are arranged between a plurality of photoelectric conversion units included in the first pixel row and a plurality of photoelectric conversion units included in the second pixel row.

7. The photoelectric conversion apparatus according to claim 1,
    wherein each of the pixels in the first pixel row includes a row selection transistor,
    wherein, in a planar view, a fifth gate drive line corresponding to the first pixel row extends in the second direction and drives the row selection transistor, and
    wherein, in a planar view, the fifth gate drive lines are arranged between a plurality of photoelectric conversion units included in the first pixel row and a plurality of photoelectric conversion units included in the second pixel row.

8. The photoelectric conversion apparatus according to claim 1, wherein, in a planar view, the first gate drive line corresponding to the first pixel row overlaps at least one or some of the electric carrier accumulating portions included in the plurality of pixels in the first pixel row.

9. The photoelectric conversion apparatus according to claim 7, wherein, in a planar view, the fifth gate drive line overlaps at least one or some of the electric carrier accumulating portions included in the plurality of pixels in the first pixel row.

* * * * *